United States Patent [19]
Adachi et al.

[11] Patent Number: 5,321,717
[45] Date of Patent: Jun. 14, 1994

[54] DIODE LASER HAVING MINIMAL BEAM DIAMETER AND OPTICS

[76] Inventors: Yoshifumi Adachi, 16214 Watson Cir., Westminster, Calif. 92683; Iwao P. Adachi, 15042 Temple St., Westminster, Calif. 92683

[21] Appl. No.: 43,201

[22] Filed: Apr. 5, 1993

[51] Int. Cl.$^5$ ............................................. H01S 3/08
[52] U.S. Cl. .................................... 372/100; 372/9; 372/98; 372/108
[58] Field of Search .................. 359/488, 669; 372/9, 372/101, 108, 100, 98, 107

[56] References Cited

U.S. PATENT DOCUMENTS

| | | | |
|---|---|---|---|
| 4,609,258 | 9/1986 | Adachi et al. | 359/488 |
| 5,177,750 | 1/1993 | Zorabedian | 372/101 |
| 5,212,710 | 5/1993 | Kaneda et al. | 372/71 |

*Primary Examiner*—Leon Scott, Jr.
*Attorney, Agent, or Firm*—James T. English

[57] ABSTRACT

A diode laser and optical system uses the minimum number of elements to obtain a small diameter beam (1 mm). A large numerical aperture lens collimates the full energy from the diode and the oval shaped output of the collimator is corrected for astigmatism by means of a cylinder lens and made circular by two identical prisms arranged to receive the corrected, collimated beam directly at a right angle surface of the first prism and transmit the beam after deflection to the second prism further which demagnifies the beam producing the round ($\leq 1$ mm diameter) beam spot output of the laser. The output beam is well collimated (1 mRad) and wave front aberration is diffraction limited. The spot size at 50 feet distance is maintained. In order to hold total Gaussian distribution energy, the prisms are coated with a multilayer dielectric thin film eliminate reflection and to transmit the TE mode wave without loss at the Brewster angle.

2 Claims, 6 Drawing Sheets

| | | | |
|---|---|---|---|
| 3 | Mg F2 | 134 mm | N = 1.38 |
| 2 | Ti O2 | 134 mm | N = 2 TO 22 |
| 1 | AL2 O3 | 134 mm | N = 1.6 |

F2
N = 1.614

DIODE LASER HAVING MINIMAL BEAM DIAMETER AND OPTICS

BACKGROUND OF THE INVENTION

1. Field of the Invention

This invention relates generally to laser light sources and more particularly to laser light radiation sources for precision measurements, having extremely small beam diameters with Gaussian intensity distribution and circular shape. These lasers generally use solid state diode laser sources in combination with optical elements for specific applications including optical disk recording and laser printing.

2. Description of the Prior Art

A diode laser is very small compared with a gas laser, but it emits high optical power. The beam is divergent. The divergence is different in two directions. When it is collimated, the beam is oval shape and the spot focused is elongated. To obtain a small, high energy, circular spot the beam must be made round in shape. This is done using two prisms as described in U.S. Pat. No. 4,609,258 to Adachi et.al. The application of such a collimated beam is for optical disk recording with the beam diameter 4 mm, or for laser printers, a beam diameter of 8 mm. There is need for a smaller diameter beam with strong intensity for applications as an optical "pointer" for alignmnent, and robotics vision (line illumination). In order to obtain a small diameter beam, in accordance with the prior art U.S. Pat. No. '258, a diverging beam is collimated by a lens and the oval shaped beam is corrected by a beam shaper consisting of two prisms, obtaining a 4 mm beam diameter, then demagnifying the beam diameter using an inverse Gallileo type telescope as shown in FIG. 1.

In order to make this system work:

1. The beam before the demagnifier must be well collimated
2. The air space adjustment of the demagnifier is very critical and must be carefully made.

At those steps, the output collimated beam qualities are tested by a Radial Shearing Interferometer as shown in FIG. 2. The analyzing interferogram is adjusted to the best wavefront aberration. The spot at the 50 ft test distance is compared. The flare makes a soft spot and a very difficult to obtain 1 mm sharp spot.

See: D. Malakara: Optical shop testing P. 145, Radial Initial Caps John Wiley and Sons 1977

Another method to collimate the beam is to use a graded index rod lens (Selfoc). This method loses the energy almost 35% because the numerical aperture NA of the Selfoc lens is small (=0.3) The 3 mm diameter Selfco lens has to be stopped to 2 mm to avoid any variation in refractive index distribution. The residual spherical aberration is 0.25, wave peak to valley. This has to adjusted by focus at the defined distance. Because the beam is not shaped, the spot is oval shaped.

BRIEF SUMMARY OF THE INVENTION

This invention is a diode laser and optical system having an unprecedented small diameter output optical beam (1 mm). In this invention, the full energy Gaussian distribution beam from a solid state laser diode is collimated using a large NA lens. The beam at this point is oval shaped, and this shape is corrected by two identical prisms to a circular shaped small diameter beam. The output beam is well collimated (1 mRad) and the wave front aberration is diffraction limited. Demagnifying the beam diameter using an inverse Gallileo type telescope as shown in FIG. 1 is not required.

The beam spot at the 50 feet test distance is still kept to a small size. In order to hold total energy, the prisms are coated by multilayer dielectric thin film to transmit the TE mode wave which could be reflected at near Brewster angle. This differs from the prior art which shapes the incident beam by selective polarization to achieve a desired beam shape.

DETAILED DESCRIPTION OF THE INVENTION

Figure 3:
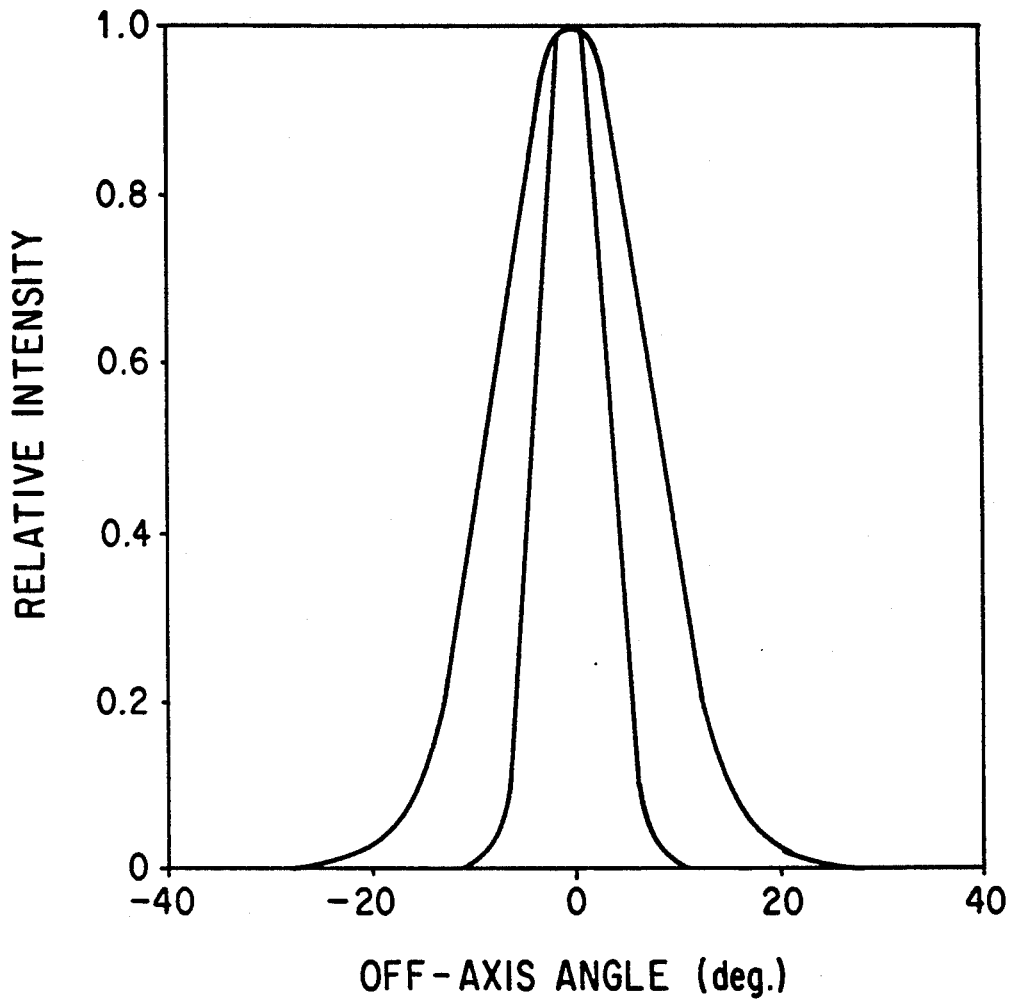
FIG. 3 is an example of a far-field pattern of diode laser TOLD9200, commercially available from Micro-Laser.
Figure 4:
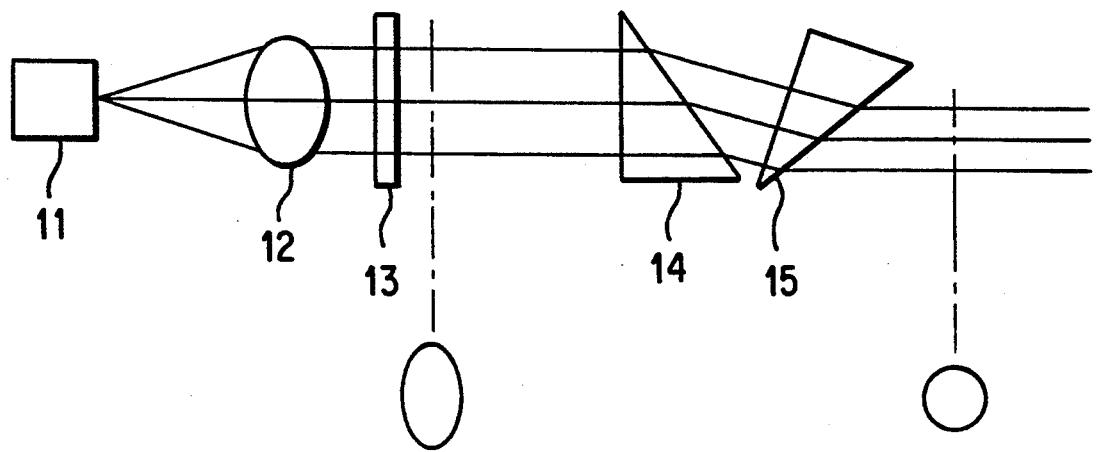
FIG. 4 is an optical layout in accordance with the invention to obtain small diameter beam.

Referring now to the diode characteristics FIG. 3 and the optical schematic diagram FIG. 4, the diode laser 11 typically has the following characteristics: Micro-Laser TOLD9200 (CPS type) FIG. 3, has emitting wave length 670 nm, beam divergence 34 degree perpendicular to the junction, and 7 degree parallel to the junction. The size of the emitting spot (near field pattern) of the end face of the emission, is about $2 \times 7$ micrometers. The astigmatism is about 40 micrometers. To accept the beam a numerical aperture NA=0.56 collimating lens 12 is necessary. The NA is numerical aperture calculated by (aperture radius )/( focal length). TOLD 9211 (BH type) has the same wavelength but larger spread 15 degrees parallel to the junction and smaller astigmatism.

Figure 2:
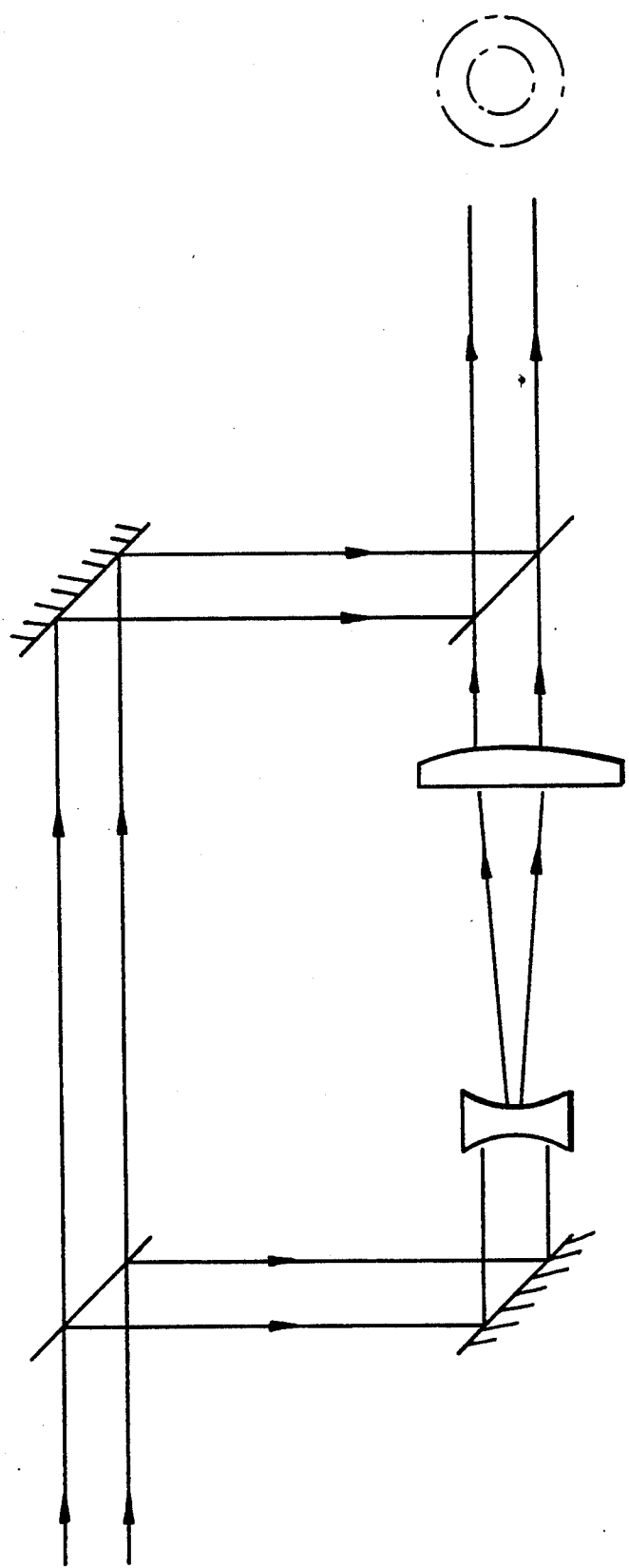
FIG. 2 is a drawing showing a Radial shearing interferometer for testing collimation of a beam.

CPS: Channel substrate planar or Gain guided type
BH: buried heterostructure or id-index guided type The expanding beam from the diode laser 11 FIG. 4 is collimated by a lens 12, NA=0.56, focal length 4 mm, diameter 4.5 mm. to accept all the Gaussian beam. The astigmatism is corrected using a cylinder lens 13. This is tested by a radial shearing interferometer FIG. 2 and is adjusted to perfect collimation. The wavefront aberration is less than 110 wave peak to valley. The beam intensity profile is oval shaped 4:1.

The beam is then shaped to shrink-in perpendicular to the junction using 2 identical prisms as shown in FIG. 4 and obtain a 1.125 mm diameter output beam. The beam divergence is 1 mRad, and the beam has a Gaussian distribution; there is no truncation. If the beam is truncated the diffraction ring appears making the beam appear fuzzy. The prisms both have multilayer dielectric thin film coatings to pass the TE wave effectively.

Figure 5:
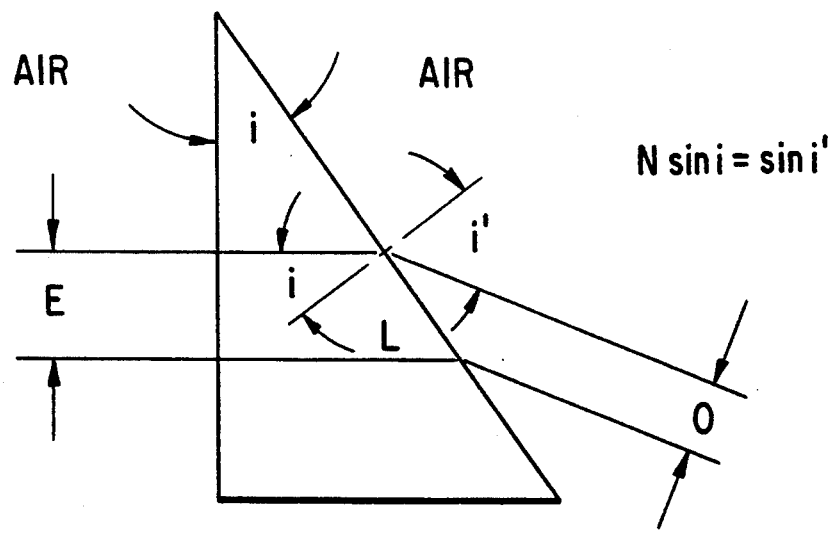
FIG. 5 illustrates Beam shrinking (demagnifying) by Prism. The beam enters perpendicular to the prism, then refracts at the hypotenuse side as shown.

The beam enters the prism 14 perpendicular to the surface, then refracts at the hypotenuse side 14'. This demagnification is as shown in FIG. 5; The refractive index of the prism is N. The entrance beam diameter is E, and the exit side beam is O. The beam O is smaller than E, therefore the beam is demagnified. The apex angle of the prism is i.

then $N \sin i = \sin i'$, We obtain de magnification:

$$m = E/O = \cos i/\cos i' = \frac{\cos\{\arcsin(N \sin I)\}}{\cos i}$$

When 2 prisms are used the beam shape $M = m^2$ (see Adachi et al U.S. Pat. No. 4,609,258)

Figure 1:
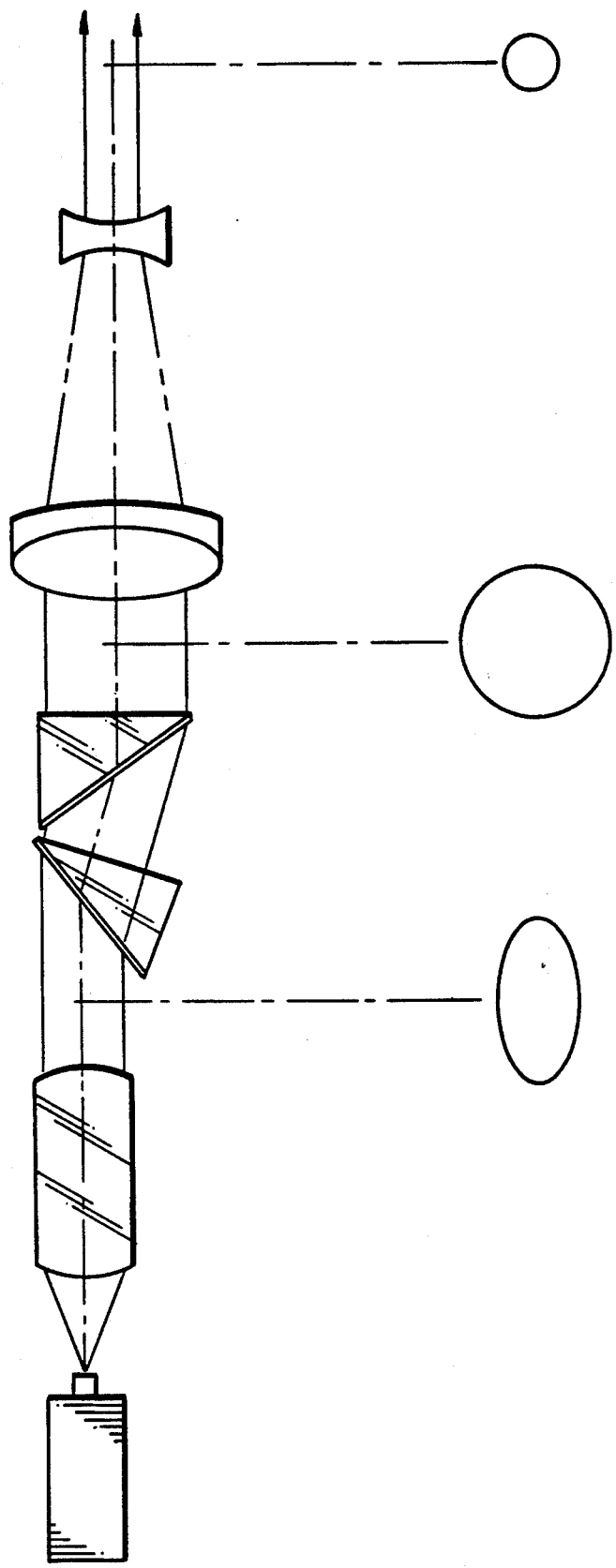
FIG. 1 is a schematic drawing of the optical elements in the prior art.

Using 2 prisms of Flint glass $N = 1.614$ at 670 nm and correcting the beam's 4:1 oval shape to circular shape, the prism apex angle i is 34.4 degrees and outgoing angle from hypotenuse surface i' is 65.76 degrees. Because this is close to the Brewster angle, where the polarization at the surface of a medium is the angle whose tangent is equal to the refractive index of the medium, the TE wave is reflected 28% but the TM wave is 0% reflected, and transmits with no loss. However, we need the TE wave transmitted with no loss to preserve the brightness of the laser radiation. This is accomplished by demagnifying the beam shape. The diode laser has to be rotated 90 degrees with respect to magnifying scheme of prior U.S. Pat. No. 4,609,258 (See FIG. 1 Prior Art) and the beam passing in the opposite directions through the two prisms. In order to accomplish this, a multilayer dielectric coating is applied to the hypotenuse side of the two prisms to minimize the TE wave reflection. This coating is:

For diode laser wavelength 670 nm,

|  | Refractive Index | Normalized Thickness | Material |
| --- | --- | --- | --- |
| Double layer: | L:N = 1.38 |  | MgF2 |
|  | H:N = 2-2.22 | 1 | TiO2/ZrO2 |
|  | Glass |  |  |
| Triple layer: | L:N = 1.38 | 1 | MgF2 |
|  | H:N = 2-2.2 | 1 | TiO2/ZrO2 |
|  | M:N = 1.6 | 1 | Al2O3 |
|  | Glass |  |  |

Substrate glass F2, $N = 1.614$

Figure 6:
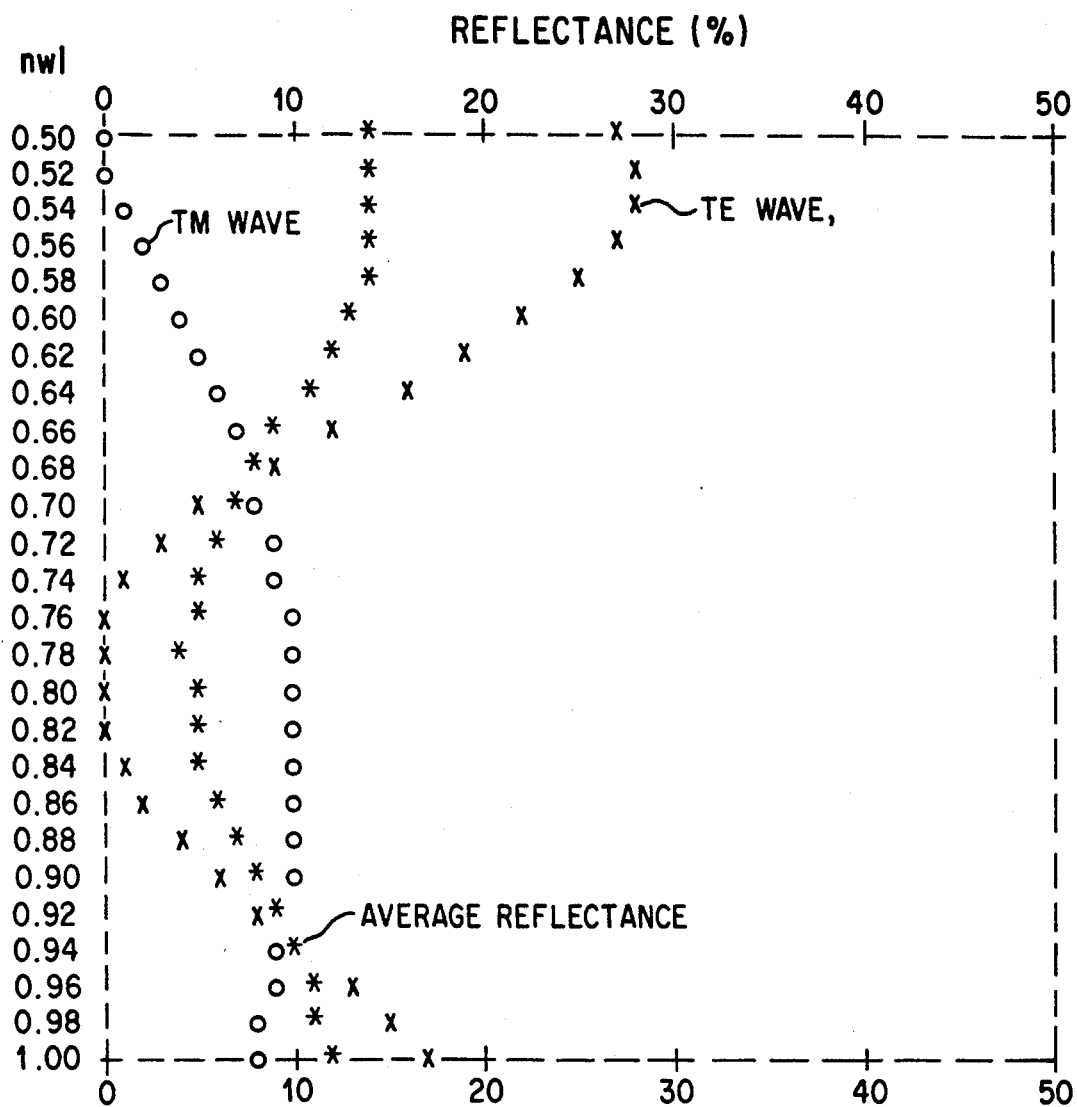
FIG. 6 is a graph that shows the reflectance of a double layered coating and illustrates that the coating supports the TE mode of transmission through the prism.

In either the double or triple layer case reflection of TE wave is minimum (0.2%) and less than 1% with 50 nm band width as shown in the results of calculations in FIG. 6; this bandwidth covers wavelength shift by ambient temperature change. For a temperature change from 0° to 40 degrees C., the wavelength shift is 10 nm.

In FIG. 6, the vertical line is normalized wavelength with $\frac{1}{4}$ wave unit. The abscissa is reflectance in %. The zero reflectance is 100% transmittance. The reflection becomes minimum at 0.8 nwl. Because the wavelength is 670 nm, the 0.8 nwl thickness is $0.8 \times 670/4 = 134$ nm.

Figures 7, 8:
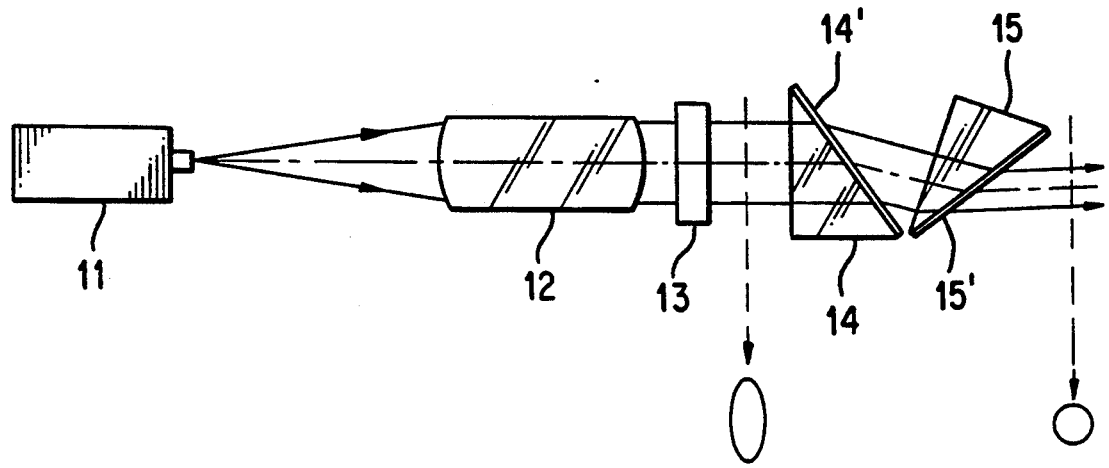
FIG. 7 illustrates the location of the dielectric thin film coatings in relation to the laser beam and optics.
FIG. 8 illustrates the dielectric coating layers for passing the TE mode of the laser radiation.

In FIG. 7 we see the diode laser 11, the collimator 12, the cylinder lens 13 and the beam shaper consisting of the two prisms 14 and 15, each having a multi layered coating 14' and 15' on the hypotenuse. It will be noted that since the laser diode orientation has been shifted 90 degrees, the beam enters at 90 degrees to the prism 14, being elongated vertically and, when entering the beam shaper it is refracted and demagnified by the prisms 14, 15. The multilayer thin films 14' and 15' allow the reflection of the beam to be minimal and pass the TE mode substantially without loss.

FIG. 8 shows the compositions applied as thin film reflection coatings to the prisms. For a glass F2 having an index of refraction $N = 1.614$, a first coating of Aluminum oxide would be applied 134 nanometers thick and having an index of refraction of 1.6. A second coating of Titanium oxide 134 nanometers thick, having an index of refraction of 2 to 22 would then be applied; then a layer of Magnesium fluoride, 134 nanometers thick, having an index of refraction of 1.38 would be applied. In the configuration shown in FIG. 7, these coatings will produce the bright TE mode of propagation at full laser power and a 1 millimeter beam diameter spot for precision instrument applications.

Thus has been described the preferred embodiments of the invention. It is recognized that modifications, alterations and other modes of operation of the invention will be apparent to those skilled in the art and, consequently, it is intended that the claims be interpreted as having these variations included therein.

What is claimed is:

1. A laser having an output beam diameter of one millimeter or less, which comprises:
   diode means for emitting a beam of electromagnetic radiation substantially elliptic in cross section having an elongated dimension;
   a collimation lens in the beam of said diode, collimating the beam thereof, producing a collimated beam of elliptic cross section;
   a cylinder lens receiving the collimated beam from said collimation lens, correcting astigmatism of the beam;
   a beam shaper spot size reducer consisting of:
      a first prism having a right angular surface receiving the collimated elliptic cross section beam from said cylinder lens, and a hypotenuse surface oriented along the elongated dimension of said diode means emitted beam, and refracting the beam having a collimated elliptic cross section from said cylinder lens, producing a circular beam output of reduced spot size; and
      a layered reflectance coating on the hypotenuse of the prism receiving the electromagnetic radiation TE and TM modes, passing both modes and preventing reflection of the TE mode at the Brewster angle;
      a second prism receiving the circular refracted beam having a collimated circular cross section from said first prism, on a right angular surface and a hypotenuse surface refracting the beam and redirecting the circular beam output from said first prism; and
      a layered reflectance coating on the hypotenuse of the prism receiving the electromagnetic radiation TE and TM modes, passing both modes and preventing reflection of the TE mode at the Brewster angle;
   whereby radiation from the diode means is collimated and corrected for astigmatism, by the collimating and cylinder lenses, and the beam shaped, spot size reduced and redirected by the beam shaping and demagnifying prisms to obtain a circular output beam of one millimeter diameter with minimal radiated power loss.

2. The composition of the layered reflectance coating for claim 1 for passing the TE mode for brightening the beam through a prism, by a coating on the hypotenuse of the prism consisting of:
   a first coating 134 nanometers thickness $AL_2O_3$ refractive index 1.6;
   a second coating 134 nanometers thickness $TiO_2$ refractive index 2 to 2.2;
   a third coating 134 nanometers thickness $MgF_2$ refractive index 1.38.

* * * * *